(12) United States Patent
Schott et al.

(10) Patent No.: US 7,872,322 B2
(45) Date of Patent: Jan. 18, 2011

(54) MAGNETIC FIELD SENSOR WITH A HALL ELEMENT

(75) Inventors: Christian Schott, Lussy-sur-Morges (CH); Radivoje Popovic, St-Sulpice (CH); Pierre-Andre Besse, Ecublens (CH); Enrico Schurig, Chavannes-pres-Renes (CH)

(73) Assignee: Melexis Tessenderlo NV, Bevaix (CH)

( * ) Notice: Subject to any disclaimer, the term of this patent is extended or adjusted under 35 U.S.C. 154(b) by 257 days.

(21) Appl. No.: 10/527,757

(22) PCT Filed: Sep. 10, 2002

(86) PCT No.: PCT/CH02/00497

§ 371 (c)(1),
(2), (4) Date: Mar. 10, 2005

(87) PCT Pub. No.: WO2004/025742

PCT Pub. Date: Mar. 25, 2004

(65) Prior Publication Data

US 2006/0011999 A1    Jan. 19, 2006

(51) Int. Cl.
*H01L 27/22* (2006.01)
(52) U.S. Cl. .................. 257/427; 257/426; 257/653; 257/E23.005
(58) Field of Classification Search ......... 257/421–427, 257/108, 206, 414, 515, 208, 210, 252, 347, 257/401
See application file for complete search history.

(56) References Cited

U.S. PATENT DOCUMENTS

| | | | | |
|---|---|---|---|---|
| 4,037,150 A | | 7/1977 | Taranov et al. | |
| 4,829,352 A | * | 5/1989 | Popovic et al. | 257/426 |
| 4,929,993 A | * | 5/1990 | Popovic | 257/424 |
| 5,057,890 A | | 10/1991 | Falk et al. | |
| 5,530,345 A | * | 6/1996 | Murari et al. | 324/207.2 |
| 5,548,151 A | * | 8/1996 | Funaki et al. | 257/421 |

(Continued)

FOREIGN PATENT DOCUMENTS

| | | |
|---|---|---|
| EP | 0 362 493 A1 | 7/1989 |
| JP | 3011679 A | 1/1991 |

OTHER PUBLICATIONS

Falk U: "A symmetrical vertical Hall-effect device", Sensors and Actuators A (Physical), Bd. A22, Nr. 1-3, Mar. 1990, pp. 751-753, XP000358526 ISSN: 0924-4247.

(Continued)

*Primary Examiner*—Zandra Smith
*Assistant Examiner*—Tsz K Chiu
(74) *Attorney, Agent, or Firm*—McCormick, Paulding & Huber LLP

(57) ABSTRACT

A symmetrical vertical Hall element comprises a well of a first conductivity type that is embedded in a substrate of a second conductivity type and which is contacted by four contacts serving as current and voltage contacts. From the electrical point of view, such a Hall element with four contacts can be regarded as a resistance bridge formed by four resistors $R_1$ to $R_4$ of the Hall element. From the electrical point of view, the Hall element is then regarded as ideal when the four resistors $R_1$ to $R_4$ have the same value. The invention suggests a series of measures in order to electrically balance the resistance bridge. A first measure exists in providing at least one additional resistor. A second measure exists in locally increasing or reducing the electrical conductivity of the well. A third measure exists in providing two Hall elements that are electrically connected in parallel in such a way that their Hall voltages are equidirectional and their offset voltages are largely compensated.

14 Claims, 3 Drawing Sheets

U.S. PATENT DOCUMENTS 5,572,058 A    11/1996  Biard
5,920,106 A *   7/1999  Oba et al. .................... 257/419
6,492,697 B1 * 12/2002  Plagens et al. .............. 257/426
6,903,429 B2 *  6/2005  Berndt et al. ............... 257/414

OTHER PUBLICATIONS

Roumenin C S : "Parallel-field Hall microsensors: an overview", Sensors and Actuators A (Physical), Bd. A30, No. 1-2 Jan. 1992, pp. 77-87, XP000277696 ISSN: 0924-4247.

Schurig E et al.: CMOS Integrated vertical Hall sensor with low offset:, Proceedings Eurosensors XVI, 16th European Conference on Solid-State Transducers, Prague, Czech Republic, 15.-18. Sep. 2002, pp. 868-871, XP002241233.

Steiner R et al. "Double-Hall sensor with self-compensated offset", International Electron Devices Meeting, IEDM 97, Washington, D.C. USA, 7.-10. Dezember pp. 911-914, XP000855940 ISBN:0-7803-4100-7.

Schurig E et al: "A vertical Hall device in CMOS Integrated high-voltage technology", Sensors and Actuators A (Physical), 97-98 (2002) 47-53.

* cited by examiner

MAGNETIC FIELD SENSOR WITH A HALL ELEMENT

CROSS REFERENCE TO RELATED APPLICATION

The present application is related to and claims priority of the PCT application number PCT/CH02/00497 of Sentron AG entitled Magnetic field sensor with a Hall element, filed on Sep. 10, 2002, the disclosure of which is incorporated by reference.

FIELD OF THE INVENTION

The invention concerns a magnetic field sensor with a symmetrical vertical Hall element of the type.

For years now, magnetic field sensors that are based on a Hall element have been produced in large numbers and are used in industry, in household equipment and in vehicle manufacture as position switches or for position measurement. Hall elements that are manufactured with customary IC technology have all the advantages of this technology in particular the high reproducibility of their magnetic and electrical characteristics at comparatively low cost. So-called horizontal Hall elements are used for measuring the components of the magnetic field that run vertically to the chip surface, while so-called vertical Hall elements are used for measuring the components of the magnetic field that run parallel to the chip surface.

A conventional Hall element has four contacts, namely two current contacts for the supply and discharge of a current flowing through the Hall element and two voltage contacts for tapping the Hall voltage produced by the component of the magnetic field to be measured. A fundamental problem of the Hall elements is that a voltage, the so-called offset voltage, is present between the two voltage contacts even when no magnetic field is present. Two techniques have been developed in order to reduce the offset voltage. With one technique that is applied with horizontal Hall elements, two horizontal Hall elements are used whereby the two currents that flow through the two Hall elements form an angle of 90°. With the other technique known from U.S. Pat. No. 4,037,150 that is suitable for symmetrical Hall elements that are electrically invariant in relation to a reversal of the current and voltage contacts, the current and voltage contacts are electrically commutated. In accordance with U.S. Pat. No. 5,057,890, this technique that was developed for horizontal Hall elements can also be used for vertical Hall elements with which the position and size of the current and voltage contacts have been calculated by means of conformal mapping of a symmetrical horizontal Hall element.

The present invention concerns symmetrical vertical Hall elements, these are Hall elements with which four contacts, namely two inner and two outer contacts, are arranged along a line. Typically, the two inner contacts are the same size and the two outer contacts are the same size. The current always flows from one inner contact to the not neighbouring outer contact or vice versa. With these symmetrical vertical Hall elements, because of their geometrical symmetry, the current and voltage contacts can be reversed, that means electrically commutated, without changing the electrical and magnetic characteristics of the Hall element.

Symmetrical vertical Hall elements are known from the above quoted U.S. Pat. No. 5,057,890 and from the article "A Symmetrical Vertical Hall-Effect Device" that was published in the magazine Sensors and they have only been manufactured with a special technology that does not allow the integration of electronic switching elements as well as Hall elements onto the same semiconductor chip.

A vertical Hall element with bipolar technology is known from U.S. Pat. No. 5,572,058. With this technology, the Hall element is insulated from the substrate so that, apart from the Hall element, electronic elements can also be integrated onto the same semiconductor chip. However, this vertical Hall element that has five contacts arranged along a straight line, namely a central contact and two outer contacts that serve as current contacts and two voltage contacts that are arranged between the central contact and one of the outer contacts, does not belong to the group of symmetrical vertical Hall elements because the electrical characteristics of the Hall element change on a reversal of the current and voltage contacts.

The object of the invention is to develop a symmetrical vertical Hall element that can be realised in an N-type well of a CMOS technology with which, in terms of potential, the two voltage contacts lie roughly in the middle between the potentials of the two current contacts and with which the offset voltage is as low as possible.

With this object, on the one hand there is the problem that the lengths of the current and voltage contacts calculated by means of conformal mapping are less than the minimum dimensions that are possible with the technology. The reason is that the depth of the N-type well is very low in comparison to the distance between the outer edges of the outer contacts. If the current and voltage contacts are enlarged in relation to the calculated ideal values corresponding to the minimum requirements of the technology, then, in terms of potential, the two voltage contacts no longer lie in the middle between the potentials of the two current contacts, the offset voltage becomes comparatively very high and the sensitivity is greatly reduced. When, in terms of potential, the two voltage contacts no longer lie in the middle between the potentials of the two current contacts, then this means that the commutation of the current and voltage contacts can no longer be meaningfully applied. Furthermore, the doping of the N-type well is not homogenous. This has the result that firstly the largest part of the current flows directly underneath the surface of the Hall element, typically in a layer of only one to two micrometers thickness even when the N-type well has a diffusion depth of several micrometers and, secondly the theory of conformal mapping is no longer applicable.

The invention starts with a symmetrical vertical Hall element with four contacts, namely two inner and two outer contacts that are arranged along a line on the surface of a semiconductor chip. The two inner contacts are preferably of the same width and the two outer contacts are preferably of the same width whereby the width of the contacts is measured in the direction of the straight line.

The symmetrical vertical Hall element comprises a well of a first conductivity type that is embedded in a substrate of a second conductivity type. The four contacts contact the well. From the electrical point of view, such a Hall element with four contacts can be regarded as a resistance bridge formed by four resistors $R_1$ to $R_4$ of the Hall element. When operating the Hall element as a magnetic field sensor, a current always flows between two contacts that are not adjacent. From the electrical point of view, the Hall element is then regarded as being ideal when the four resistors $R_1$ to $R_4$ have the same value. In this case, on supplying the Hall element via two current contacts, the contacts serving as voltage contacts are located on the same electrical potential namely the potential of half of the supply voltage. Furthermore the voltage between the voltage contacts, the so-called offset voltage, is then equal to zero, ie, the offset voltage disappears. The same is also valid when the roles of the current and voltage contacts are reversed.

In accordance with the invention it is suggested to arrange the four contacts of the Hall element in such a way that three of the four resistors $R_1$ to $R_3$ for geometrical reasons are almost the same size. The fourth resistor $R_4$, namely the electrical resistance between the two outer contacts, is larger than the other resistors $R_1$, $R_2$ and $R_3$. In order to balance the resistance bridge, in accordance with the invention it is furthermore suggested to arrange another resistor $R_5$ parallel to resistor $R_4$ the value of which is defined so that approximately $R_1 = R_2 = R_3 = R_4 || R_5$ is valid. The resistor $R_5$ is, for example, an external resistor. Preferably however the resistor $R_5$ is embedded in the well of the Hall element or is realised as a separate N-type well. In the first case, the resistor has at least one contact that contacts the well of the Hall element and is arranged next to one of the two outer contacts on the side facing the edge of the well of the Hall element. In this case, the advantage exists in that the resistor $R_5$ has the same temperature coefficient as the resistors $R_1$, $R_2$, $R_3$ and $R_4$ so that the resistance bridge remains balanced even with variations in temperature.

Another possibility of electrically balancing the resistance bridge exists in providing both at least one electrode electrically insulated from the well whereby the at least one electrode is arranged between two contacts. The at least one electrode serves to locally increase or reduce the electrical conductivity of the well in the area underneath the electrode.

A further possibility of electrically balancing the resistance bridge exists in locally increasing or reducing the electrical conductivity of the well in the area between two contacts by means of local implantation of additional or fewer ions.

A further possibility of electrically balancing the resistance bridge exists in using a magnetic field sensor with a first Hall element and a second Hall element that each have two inner and two outer contacts arranged along a straight line whereby preferably the two inner contacts are the same width and whereby preferably the two outer contacts are the same width, whereby the straight lines of the two Hall elements run parallel and whereby the contacts of the two Hall elements are wired via conductor paths in such a way that their Hall voltages are equidirectional and their offset voltages are largely compensated so that the total resulting offset voltage almost vanishes.

Various embodiments of the invention are explained in more detail below based on the drawings. The figures shown in the drawings are not to scale.

DETAILED DESCRIPTION OF THE PREFERRED EMBODIMENTS

Figure 1:
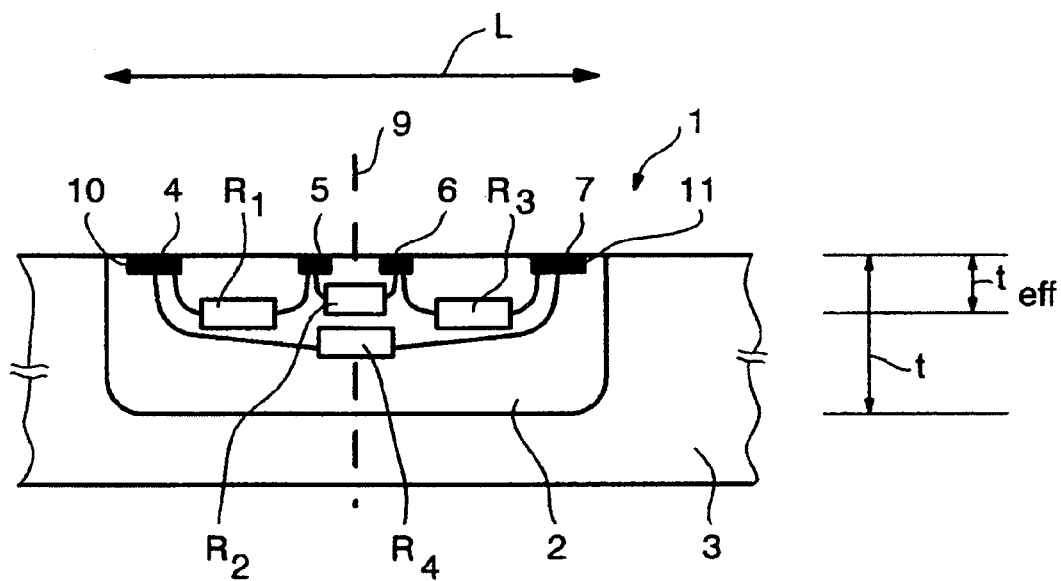
FIG. 1 shows a cross-section of a symmetrical vertical Hall element.
Figure 2:
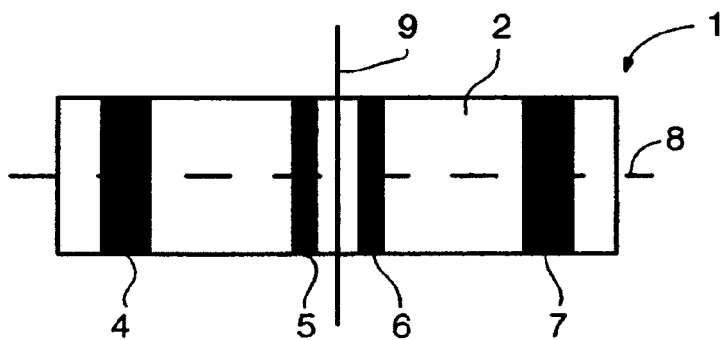
FIG. 2 shows a plan view of the symmetrical vertical Hall element.

FIGS. 1 and 2 show a cross-section and a plan view of a symmetrical vertical Hall element 1. The Hall element 1 manufactured with a CMOS technology preferably comprises a well 2 of a first conductivity type that is embedded in a substrate 3 made of silicon of a second conductivity type. The Hall element 1 has four contacts 4-7 on the surface, namely two inner contacts 5 and 6 as well as two outer contacts 4 and 7. The contacts 4-7 are arranged along a straight line 8 (FIG. 2). Preferably the two inner contacts 5 and 6 are the same width as seen along the straight line 8 and the two outer contacts 4 and 7 are the same width. The position and size of the well 2 and the contacts 4-7 are then symmetrical in relation to a plane 9 that runs perpendicularly to the straight line 8 and in the middle between the two inner contacts 5 and 6. (For technological reasons it makes sense to make the two inner contacts 5 and 6 the same width and the two outer contacts 4 and 7 the same width but is not absolutely necessary.)

Because with silicon the mobility of the electrons is greater than the mobility of the holes, it is advantageous when an N-type well and not a P-type well is used for the Hall element 1. A P-type well could be used for the Hall element 1 however the sensitivity of the magnetic field sensor would then be distinctly lower.

The depth t of the well 2 amounts typically to around 5 µm. Because the doping of the well 2 is not homogenous but reduces exponentially with increasing depth, the greatest part of the current flows underneath the surface of the Hall element 1 in a thin layer of typically 1-2 µm thickness. The depth $t_{\mathit{eff}}$ of the well 2 effective for the electrical and magnetic characteristics of the Hall element 1 therefore only amounts to around 1-2 µm. The length L of the Hall element 1 is given by the length of the well 2. Essentially, it corresponds to the distance between the outer edges 10 and 11 of the outer contacts 4 and 7. The length L is large in comparison to the depth t or to the effective depth $t_{\mathit{eff}}$. The electrical characteristics of the Hall element 1 can be represented by a resistance bridge formed from four resistors $R_1$ to $R_4$. For ease of understanding, in FIG. 1 the resistances prevailing between two contacts are each presented by a resistor symbol $R_1$ to $R_4$ and a line that connects the contacts corresponding to the resistor.

Figure 3:
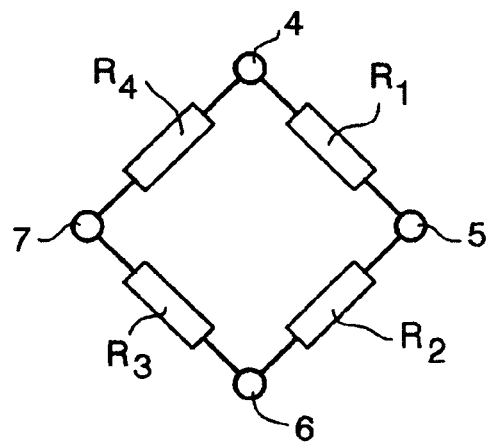
FIG. 3 shows an equivalent circuit diagram for the symmetrical vertical Hall element.

FIG. 3 shows the electrical circuit diagram of the resistance bridge formed by the four resistors $R_1$ to $R_4$ of the Hall element 1. On operation of the Hall element 1 as a magnetic field sensor, a current always flows between two contacts that are not adjacent, for example between the contacts 4 and 6 or between the contacts 5 and 7. Form the electrical point of view, the Hall element 1 is then regarded as ideal when the four resistors $R_1$ to $R_4$ have the same value. In this case, on supplying the Hall element 1 via the contacts 4 and 6, the contacts 5 and 7 serving as voltage contacts both have the same electrical potential, namely the potential of half the supply voltage. Furthermore, the voltage between the voltage contacts is then equal to zero, ie, the offset voltage vanishes. The same is valid when the Hall element 1 is supplied via the contacts 5 and 7 and the contacts 4 and 6 serve as voltage contacts.

For geometrical reasons, the resistors $R_1$ and $R_3$ are the same size. The resistor $R_2$ can be altered by increasing or reducing the distance between the inner contacts 5 and 6. By means of appropriate selection of the position and size of the contacts 4-7, one can therefore achieve that approximately $R_1=R_2=R_3$ is valid. In addition, it is valid that the resistor $R_4$ is larger than the other resistors $R_1$, $R_2$ and $R_3$. In order to balance the resistance bridge, in accordance with the invention it is suggested to arrange a further resistor $R_5$ parallel to the resistor $R_4$ the value of which is defined so that approximately $R_1=R_2=R_3=R_4||R_5$ is valid. The resistor $R_5$ is for example an external resistor. However the resistor $R_5$ is preferably embedded in the N-type well 2 of the Hall element 1 or is realised as a separate N-type well. In this case, the advantage lies in that the resistor $R_5$ has the same temperature coefficient as the resistors $R_1$, $R_2$, $R_3$ and $R_4$ so that the resistance bridge remains balanced even with temperature variations.

Figure 4:
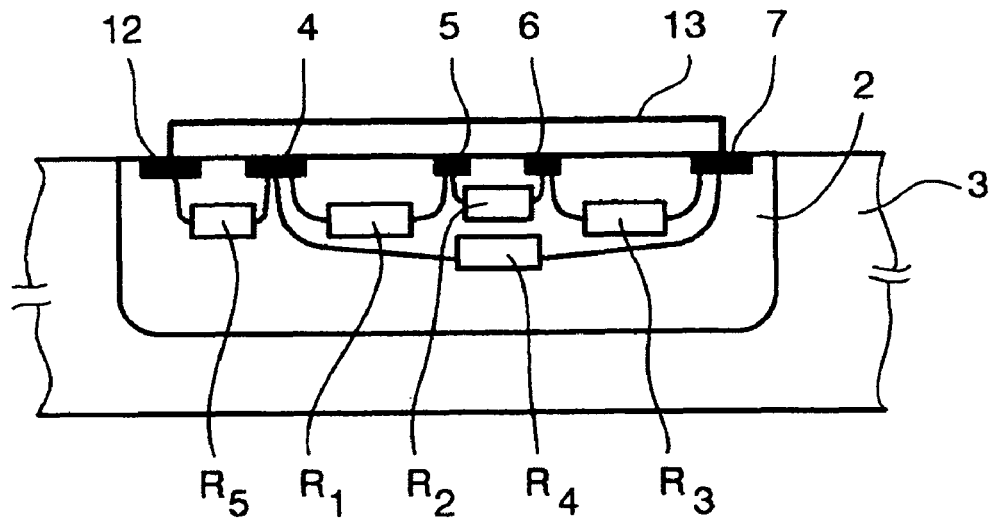
FIG. 4 shows a symmetrical vertical Hall element with an integrated resistor.
Figure 5:
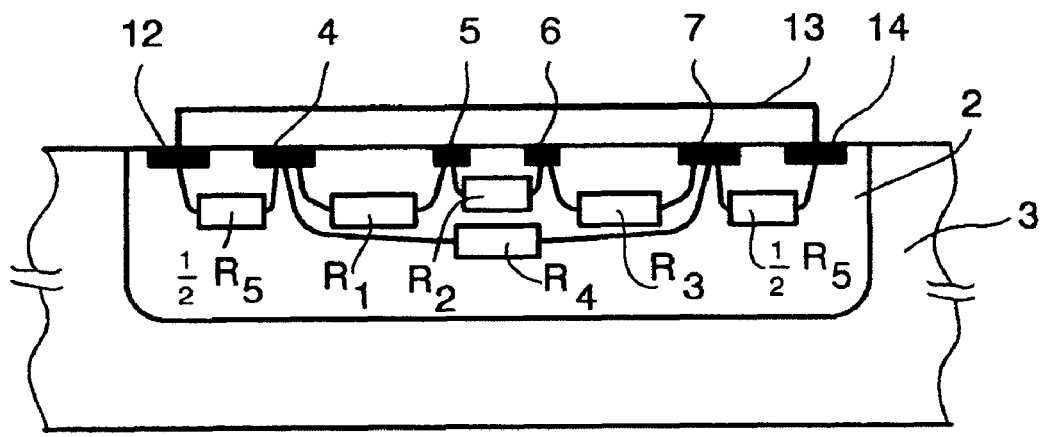
FIG. 5 shows a symmetrical vertical Hall element with two integrated resistors.

FIGS. 4 and 5 show two examples with which the resistor $R_5$ is embedded in the well 2 of the Hall element 1. For ease of understanding, the resistances prevailing between two contacts are again represented by a resistor symbol and a line connecting the corresponding contacts. With the example according to FIG. 4, a further contact 12 is arranged next to the contact 4 that is connected to the contact 7 by a purely schematically represented conductor path 13. With the example according to FIG. 5, a further contact 12 is arranged next to the contact 4 and a further contact 14 is arranged next to the contact 7 whereby the two additional contacts 12 and 14 are again connected by an only schematically represented conductor path 13. With this example therefore the resistor $R_5$ is realised not by means of one single resistor but by means of two resistors with the value $\frac{1}{2}R_5$.

Limits are set on the miniaturisation of the Hall element in that a technology dependent minimum distance has to be maintained between the two inner contacts 5 and 6. Today, this minimum distance lies in the area of around 0.8 μm. The resistor $R_2$ can therefore not fall below a certain value predetermined by the technology used. In the following, further examples are explained as to how the resistors $R_1$ to $R_3$ can be increased or reduced.

Figure 6:
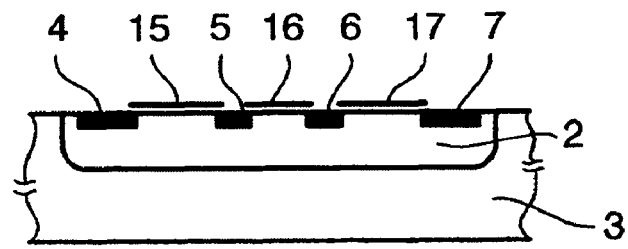
FIG. 6 shows a symmetrical vertical Hall element with additional electrodes.

With the example according to FIG. 6 three electrodes 15-17 are arranged between the contacts 4-7 that, for example, are realised out of polysilicon like the gate electrodes of a MOSFET. The electrodes 15-17 are separated from the N-type well for example by means of a thin oxide layer and therefore electrically insulated from the N-type well 2. On operation of the Hall element 1, each of the electrodes 15-17 is biased with a predetermined voltage in relation to the N-type well 2. The electrodes 15 and 17 are biased with the same voltage while the electrode 16 is biased with a voltage of reverse polarity. The biasing of an electrode in relation to the N-type well 2 has the effect that, dependent on the sign of the bias, the charge carrier density in the area underneath the electrode is either increased or decreased. In order to increase the charge carrier density, the bias of the electrode has to be inverse to the type of the charge carriers of the well 2. When the well 2 is N-type, then the bias of the electrode has to be positive in relation to the potential of the well 2. In order to reduce the charge carrier density, the bias of the electrode has to be of the same type as the charge carriers and of the well 2. When the well 2 is N-type, then in this case the bias of the electrode has to be negative in relation to the potential of the well 2.

It is also possible, instead of three electrodes 15, 16 and 17 to provide only one single electrode, namely the electrode 16 between the inner contacts 5 and 6 or only the two electrodes 15 and 17 that are each arranged between an inner and an outer contact. Furthermore, it is possible with the example according to FIG. 4 to provide an additional electrode that is arranged between the contacts 4 and 12 or, with the example according to FIG. 5, to provide two additional electrodes that are arranged between the contacts 4 and 12 and between the contacts 7 and 14. By selecting the size and sign of the bias applied to the individual electrodes, the resistors $R_1$ to $R_5$ can be altered within certain limits. Therefore, electronic voltage sources are provided that are realised in the same semiconductor chip as the Hall element 1, whereby the biases to be applied to the individual electrodes are determined once in a calibration procedure so that the resistance bridge formed by the resistors $R_1$ to $R_5$ is optimally balanced.

Figure 7:
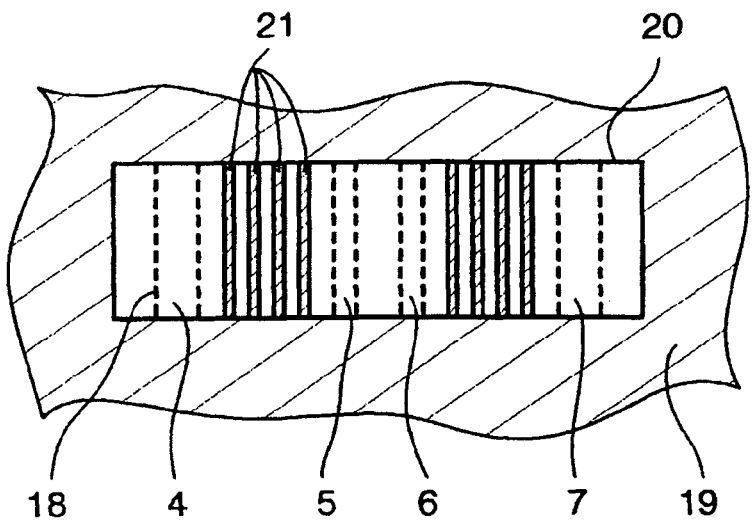
FIG. 7 shows a mask that, on the implantation of ions, is used for the formation of an N-type well.

A further possibility of reducing or increasing the resistors $R_1$ to $R_3$ with given position and size of the contacts 4-7 exists in increasing or reducing the charge carrier density by means of the local implantation of additional or fewer ions. This possibility is explained in more detail based on FIG. 7. The contacts 4 to 7 are represented by areas that are bordered with a broken line 18. With the formation of the N-type well 2, a mask 19 is used for the ion implantation that does not have one single opening 20 corresponding to the size of the well 2 but an opening 20 that has local islands 21 that cover a part of the opening 20 so that the doping of the N-type well 2 varies locally. The dimensions of the islands 21 are selected so small that the areas separated by the islands 21 connect to the N-type well 2 on the diffusion following the implantation. The doping of the well 2 in the area between the two inner contacts 5 and 6 is therefore different to the doping of the well 2 in the areas between an inner contact and an adjacent outer contact.

Figure 8:
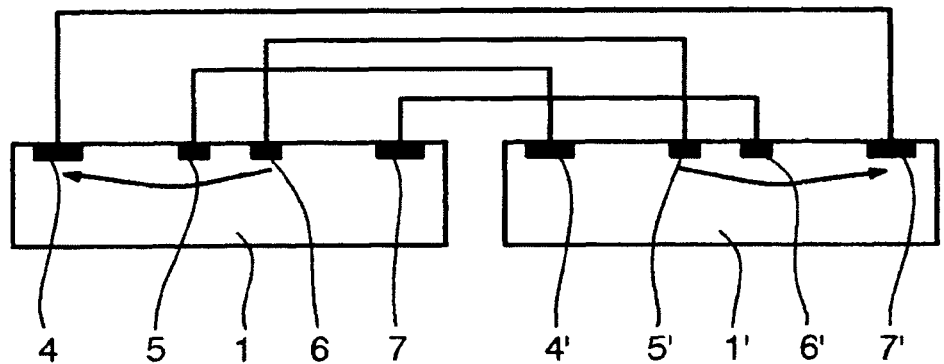
FIGS. 8, 9 show two anti-parallel connected Hall elements.
Figure 9:
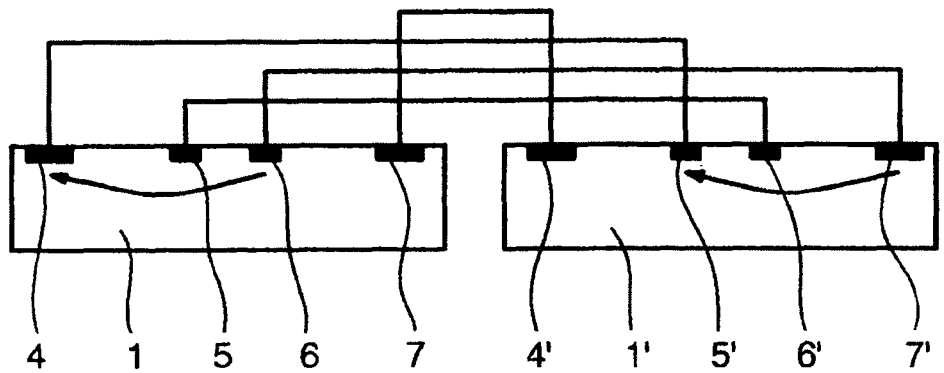

FIGS. 8 and 9 illustrate a further possibility of largely balancing the resistance bridge formed by the resistors $R_1$ to $R_4$, namely by the parallel connection of two Hall elements 1 and 1' that are arranged parallel to each other so that they measure the same component of the magnetic field. The directions of the currents flowing through the two Hall elements 1 and 1' are presented symbolically by means of arrows that point from the contact where the current is supplied to the contact where the current is discharged. The contacts 4-7 of the first Hall element 1 and the contacts 4'-7' of the second Hall element 1' are wired in pairs via schematically presented conductors paths to 13. The wiring has to fulfil two criteria that are described as follows. First of all, the Hall voltages of the two Hall elements 1 and 1' produced by the magnetic field have to be equidirectional otherwise the magnetic field sensor does not "see" the magnetic field. When the two current contacts are connected by an arrow that indicates the direction of the current, then one voltage contact is always located on the left-hand side of the arrow and one voltage contact on the right-hand side of the arrow. Equidirectional now means that the two voltage contacts of the two Hall elements 1 and 1' that lie on the left-hand side of the corresponding arrow have to be connected and that the two voltage contacts of the two Hall elements 1 and 1' that lie on the right-hand side of the corresponding arrow have to be connected. If the two Hall elements 1 and 1' were not wired, then with the first Hall element 1, one of the two voltage contacts 5 and 7 would carry a higher potential than the other voltage contact as the resistor $R_4$ is larger than the other resistors $R_1$, $R_2$ and $R_3$. Equally, with the second Hall element 1' one of the two voltage contacts 4' and 6' would carry a higher potential than the other voltage contact as here also the resistor $R_4'$ is larger than the other resistors $R_1'$, $R_2'$ and $R_3'$. With the example in FIG. 8—with the direction of the current presented in FIG. 8—the voltage contact 7 of the first Hall element 1 carries the higher potential than the voltage contact 5. With the second Hall element 1' the voltage contact 4' carries the higher potential than the voltage contact 6'. Secondly, the voltage contacts 7, 5, 4' and 6' of the two Hall elements 1 and 1' are now to be wired in such a way that the voltage contact 7 of the first Hall element 1 that carries the higher potential is connected to the voltage contact 6' of the second Hall element 1' that carries the lower potential. Because of this wiring, the currents flowing through the two Hall elements 1 and 1' are distributed in such a way that, with vanishing magnetic field, the voltage applied between the voltage contacts 7 and 5 of the first Hall element 1, the so-called offset voltage, is much lower than it would be without connection of the second Hall element 1' in the way described. With the example presented in FIG. 8, the contacts 4-7 of the first Hall element 1 and the contacts 4'-7' of the second Hall element 1' are wired in pairs as follows: The contact 4 with the contact 7', the contact 5 with the contact 4', the contact 6 with the contact 5' and the contact 7 with the contact 6', whereby the currents in both Hall elements 1 and 1' always flow from an inner contact to the not adjacent outer contact but in the opposite direction.

With the example presented in FIG. 9, the currents flow in the same direction, with the first Hall element 1 from an inner contact to the not adjacent outer contact, however with the second Hall element 1' from an outer contact to the not adjacent inner contact. The contacts 4-7 of the first Hall element 1 and the contacts 4'-7' of the second Hall element 1' are wired in pairs as follows: The contact 4 with the contact 5', the contact 5 with the contact 6', the contact 6 with the contact 7' and the contact 7 with the contact 4' so that the two criteria given above are fulfilled.

With the embodiments described up to now the symmetrical vertical Hall element 1 is embedded in the N-type well 2 that has been produced in a P-type substrate by the implantation of ions and the subsequent diffusion. Such a technology is generally designated as CMOS technology. However, instead of a CMOS technology, a bipolar technology can also be used with which the symmetrical vertical Hall element 1 is embedded in an insulated area in an epitactical layer. Such an insulated area can also be designated as N-type well. While the N-type well produced with bipolar technology is homogeneously doped with impurity atoms, the doping of the N-type well produced with CMOS technology is not homogeneous.

The invention claimed is:

1. A magnetic field sensor comprising a Hall element comprising a first contact, a second contact, a third contact and a fourth contact arranged in this sequence along a straight line on a surface of a first well of a first conductivity type that is embedded in a substrate of a second conductivity type, said four contacts being two inner contacts and two outer contacts, a first of said two outer contacts and a first of said two inner contacts for supply and discharge of a current flowing through the first Hall element, wherein the first of said two outer contacts and the first of said two inner contacts are not adjacent contacts, and a second of said two outer contacts and a second of said two inner contacts for tapping a first Hall voltage, wherein the two inner contacts are the same width and wherein the two outer contacts are the same width, wherein a distance between the first contact and the second contact is equal to a distance between the third contact and the fourth contact, wherein a distance between the second contact and the third contact is selected such that approximately $R_1=R_2=R_3$ wherein $R_1$ denotes a resistance prevailing between the first contact and the second contact $R_2$ denotes a resistance prevailing between the second contact and the third contact and $R_3$ denotes a resistance prevailing between the third contact and the fourth contact, and wherein the two outer contacts are connected via an additionally resistor having a resistance $R_5$ that is selected such that approximately $R_1=R_2=R_3=R_4||R_5$ wherein $R_4$ denotes a resistance prevailing between the first contact and the fourth contact.

2. The magnetic field sensor according to claim 1, wherein said additional resistor is formed by an additional well of the first conductivity type embedded in said substrate.

3. The magnetic field sensor according to claim 1, wherein a fifth contact is arranged in the well of the Hall element next to the first contact of the Hall element on a side facing an adjacent edge of the well and wherein the fifth contact is connected to the fourth contact by a conductor path, so that said additional resistor is formed by a resistance prevailing between the first contact and the fifth contact.

4. The magnetic field sensor according to claim 1, wherein a fifth contact is arranged in the sell of the Hall element next to the first contact of the arranged in the well of the Hall element next to the fourth contact of the Hall element on a side facing an adjacent edge of the well and wherein the fifth contact is connected to the sixth contact by a conductor path, so that said additional resistor is formed by a resistance prevailing between the first contact and the fifth contact and a resistance prevailing between the sixth contact and the fourth contact.

5. The magnetic field sensor according to claim 1, wherein at least one electrode electrically insulated from the well is arranged between two contacts.

6. The magnetic field sensor according to claim 2, wherein at least one electrode electrically insulated from the well is arranged between two contacts.

7. The magnetic field sensor according to claim 3, wherein at least one electrode electrically insulated from the well is arranged between two contacts.

8. The magnetic field sensor according to claim 4, wherein at least one electrode electrically insulated from the well is arranged between two contacts.

9. The magnetic field sensor according to claim 1, wherein a doping of the well in an area between the two inner contacts is different to a doping of the well in the areas between an inner contact and an outer contact.

10. The magnetic field sensor according to claim 2, wherein a doping of the well in an area between the two inner contacts is different to a doping of the well in the area between an inner contact and an outer contact.

11. The magnetic field sensor according to claim 3, wherein a doping of the well in an area between the two inner contacts is different to a doping of the well in the area between an inner contact and an outer contact.

12. The magnetic field sensor according to claim 4, wherein a doping of the well in area between the two inner contacts is different to a doping of the well in the areas between an inner contact and an outer contact.

13. A magnetic field sensor comprising a first Hall element comprising a first contact, a second contact, a third contact and a fourth contact arranged in this sequence along a first straight line on a surface of a first well of a first conductivity type that is embedded in a substrate of a second conductivity type, said four contacts being two inner contacts and two outer contact, a first of said two outer contacts and a first of said two inner contacts for supply and discharged of a current flowing through the first Hall element, wherein the first of said two outer contacts and the first of said two inner contacts are not adjacent contacts, and a second of said two outer contacts and a second of said two inner contacts for tapping a first Hall voltage, wherein the two inner contacts are the same width and wherein the two outer contacts are the same width, wherein a distance between the first contact and the second contact is equal to a distance between the third contact and the fourth contact, a second Hall element comprising a first contact, a second contact, a third contact and a fourth contact arranged in this sequence along a second straight line on a surface of a second well of the first conductivity type that is embedded in the substrate, said four contacts being two inner contacts and two outer contacts, a first of said two outer contacts and a first of said two inner contacts for supply and discharge of a current flowing through the second Hall element, wherein the first of said two outer contacts and the first of said two inner contacts are not adjacent contacts, and a second of said two outer contacts and a second of said two inner contacts for tapping a second Hall voltage, wherein the two inner contacts are the same width and wherein the two outer contacts are the same width, wherein a distance between the first contact and the second contact is equal to a distance between the third contact and the fourth contact, wherein the first and second straight line run in parallel, an wherein either the first contact of the first Hall element is connected with the fourth contact of the second Hall element, the second contact of the first Hall element is connected with the first contact of the second Hall element, the third contact of the first Hall element is connected with the second contact of the second Hall element and the fourth contact of the first Hall element is connected with the third contact of the second Hall element or the first contact of the first Hall element is connected with the second contact of the second Hall element, the second contact of the first Hall element is connected with the third contact of the second Hall element, the third contact of the first Hall element is connected with the fourth contact of the second Hall element and the fourth contact of the first Hall element is connected with the first contact of the second Hall element.

14. The magnetic field sensor according to claim 13, wherein a distance between the second contact and the third contact of the first Hall element is selected such that approximately $R_1=R_2=R_3$ wherein $R_1$ denotes a resistance prevailing between the first contact and the second contact of the first Hall element, $R_2$ denotes a resistance prevailing between the second contact and the third contact of the first Hall element and $R_3$ denotes a resistance prevailing between the third contact and the fourth contact of the first Hall element, wherein the two outer contacts of the first Hall element are connected via a first additional resistor having a resistance $R_5$ that is selected such that approximately $R_1=R_2=R_3=R_4||R_5$ wherein $R_4$ denotes a resistance prevailing between the first contact and the fourth contact of the first Hall element, wherein a distance between the second contact and the third contact of the second Hall element is selected such that approximately $R_1'=R_2'=R_3'$ wherein $R_1'$ denotes a resistance prevailing between the first contact and the second contact of the second Hall element, $R_2'$ denotes a resistance prevailing between the second contact and the third contact of the second Hall element and $R_3'$ denotes a resistance prevailing between the third contact and the fourth contact of the second Hall element, and wherein the two outer contacts of the second Hall element are connected via a second additional resistor having a resistance $R_5'$ that is selected such that approximately $R_1'=R_2'=R_3'=R_4'||R_5'$ wherein $R_4'$ denotes a resistance prevailing between the first contact and the fourth contact of the second Hall element.

* * * * *

UNITED STATES PATENT AND TRADEMARK OFFICE
CERTIFICATE OF CORRECTION

| | | |
|---|---|---|
| PATENT NO. | : 7,872,322 B2 | Page 1 of 1 |
| APPLICATION NO. | : 10/527757 | |
| DATED | : January 18, 2011 | |
| INVENTOR(S) | : Christian Schott et al. | |

It is certified that error appears in the above-identified patent and that said Letters Patent is hereby corrected as shown below:

Column 7, Claim 1, line 62, please insert --,-- after "contact" and before "R2" and
        line 66, please delete the word "additionally" and replace with --additional--.
Column 8, Claim 4, line 14, please delete the word "sell" and replace with --well--.
Column 8, Claim 10, line 41, please delete the word "area" and replace with --areas--.
Column 8, Claim 11, line 45, please delete the word "area" and replace with --areas--.
Column 8, Claim 13, line 57, please delete the word "contact" and replace with --contacts--.
Column 8, Claim 13, line 58, please delete the word "discharged" and replace with --discharge--.
Column 9, Claim 13, line 18, please delete the word "an" and replace with --and--.

Signed and Sealed this
Ninth Day of August, 2011

David J. Kappos
*Director of the United States Patent and Trademark Office*